United States Patent
Mastrangelo et al.

[11] Patent Number: 6,136,212
[45] Date of Patent: Oct. 24, 2000

[54] POLYMER-BASED MICROMACHINING FOR MICROFLUIDIC DEVICES

[75] Inventors: Carlos H. Mastrangelo; Piu F. Man; James R. Webster, all of Ann Arbor, Mich.

[73] Assignee: The Regents of the University of Michigan, Ann Arbor, Mich.

[21] Appl. No.: 08/907,184

[22] Filed: Aug. 6, 1997

Related U.S. Application Data

[60] Provisional application No. 60/023,393, Aug. 12, 1996.

[51] Int. Cl.$^7$ .......................................... B44C 1/22
[52] U.S. Cl. ............................ 216/49; 216/27; 435/287.2
[58] Field of Search ................................... 216/2, 27, 49; 313/578, 583; 435/287.2; 436/180

[56] References Cited

U.S. PATENT DOCUMENTS

| | | | |
|---|---|---|---|
| 4,456,679 | 6/1984 | Leyrer et al. | 430/326 |
| 4,896,098 | 1/1990 | Haritonidis et al. | 324/663 |
| 4,946,549 | 8/1990 | Bachman et al. | 156/643 |
| 5,031,821 | 7/1991 | Kaneda et al. | 228/110 |
| 5,144,411 | 9/1992 | Kaanta et al. | 357/68 |
| 5,190,637 | 3/1993 | Guckel | 205/118 |
| 5,258,097 | 11/1993 | Mastrangelo | 156/644 |
| 5,274,913 | 1/1994 | Grebe et al. | 29/840 |
| 5,291,066 | 3/1994 | Neugebauer et al. | 257/750 |
| 5,397,827 | 3/1995 | Kimura et al. | 524/413 |
| 5,439,768 | 8/1995 | Matuso et al. | 430/56 |
| 5,576,147 | 11/1996 | Guckel et al. | 430/313 |
| 5,767,687 | 6/1998 | Geist | 324/664 |
| 5,788,468 | 8/1998 | Dewa et al. | 417/415 |
| 5,839,722 | 11/1998 | Berlin et al. | 269/57 |
| 5,876,582 | 3/1999 | Frazier et al. | 205/122 |
| 5,903,041 | 5/1999 | La Fleur et al. | 257/530 |

FOREIGN PATENT DOCUMENTS 2672301 of 0000 France .

OTHER PUBLICATIONS

M. Esashi et al. "Normally Close Microvalve and Micropump Fabricated on a Silicon Wafer," in *International Workshop on Micro Electromechanical Systems (MEMS 89)*, pp. 29–34 (1989).

R. Zengerie et al., "A Micro Membrane Pump with Electrostatic Actuation," in *International Workshop on Micro Electromechanical Systems (MEMS 92)*, pp. 19–24 (1992).

J. Pfahler et al., "Liquid Transport in Micron and Submicron Channels," *Sensors and Actuators*, vol. A21–23, pp. 431–434 (1990).

A. Manz et al., "Integrated Electrosomotic Pumps and Flow Manifolds for Total Chemical Analysis Systems," *Tranducers '91*, pp. 939–941 (1991).

(List continued on next page.)

*Primary Examiner*—Randy Gulakowski
*Assistant Examiner*—Allan Olsen
*Attorney, Agent, or Firm*—Medlen & Carroll, LLP

[57] ABSTRACT

The present invention relates to polymer-based micro-electro-mechanical system (MEMS) technology suitable for the fabrication of integrated microfluidic systems, particularly medical and chemical diagnostics system, ink-jet printer head, as well as any devices that requires liquid- or gas-filled cavities for operation. The integrated microfluidic systems may consist of pumps, valves, channels, reservoirs cavities, reaction chambers, mixers, heaters, fluidic interconnects, diffusers, nozzles, and other microfluidic components on top of a regular circuit substrate. This technology is vastly superior than any alternatives available such as glass-based, polysilicon-based MEMS technology as well as hybrid 'circuit board' technology because of its simple construction low cost, low temperature processing, and its ability to integrate any electronic circuitry easily along with the fluidic parts.

19 Claims, 9 Drawing Sheets

OTHER PUBLICATIONS

A. Manz et al., "Planar Chips Technology for Miniaturization and Integration of Separation Techniques into Monitoring Systems: Capillary Electrophoresis on a Chip," *J. Chromatography,* vol. 593, pp. 253–258 (1992).

G. Beni and M.A. Tenan, "Dynamics of Electrowetting Displays," *J. Appl. Phys.,* vol. 52, pp. 6011–6015 (1981).

L. Lin et al., "Microbubble Powered Actuator," in *Tranducers '91,* pp. 1041–1044 (1991).

J.R. Webster et al., "Monolithic Capillary Gel Elctrophoresis Stage with On–Chip Detector," in *International Conference on Micro Electromechanical Systems (MEMS 96),* pp. 491–496 (1996).

C.H. Mastrangelo and R.S. Mullet, "Vacuum–Sealed Silicon Micromachined Incandescent Light Source," in *Int. Electron Devices Meeting (IDEM 89),* pp. 503–506 (1989).

U. Schankenberg et al., "TMAHW Etchants for Silicon Micromachining," *Tranducers '91,* pp. 815–818 (1991).

Probstein, "Physicochemical Hydrodynamics," Stoneham, MA: Buttersworth Publishing pp. 64–67, 300–315 (1989).

Tenan et al., "Friction In Capillary Systems", J. Appl. Phys. 53:6687–6692 (1982).

Dussan, "On the Spreading of Liquids on Solid Surfaces Static and Dynamic Contact Lines," Annu. Rev. Fluid Mech. 11:371 (1979).

Olsson et al., "Micromachined Diffuser/Nozzle Elements For Valve–Less Pumps", Ninth Annual IEEE Workshop on Micro Electro Mechanical Systems (1996).

Dutton, "Advances in Microfabrication Devices Lead to Innovation in Electrophoresis", Genetic Engineering News Sep. 15, 1996; and.

Kim et al., "Polymer Microstructures Formed By Moulding In Capillaries", Nature 376:581–584 (1995).

Figure 2: (a) Top view and cross-section (a) of example polymer channel with front side inlet (b) formed on top of a regular Si substrate. Channel heights can be adjusted between 0.5-100 μm.

FIG. 3

Figure 4: (a) Top view of example three-polymer channel 100 μm wide and 25 μm-thick with front side inlet. (b) closeup cross-section showing the three-polymer construction of the channels.

Figure 5: (a) Top view of 1mm² thermal cycling chamber (b) cross-section of 25 μm-high, 1mm² polymer PCR chamber fabricated on top of a silicon wafer.

POLYMER-BASED MICROMACHINING FOR MICROFLUIDIC DEVICES

This application for patent under 35 U.S.C. 111(a) claims priority to Provisional Application Ser. No. 60/023,393, filed Aug. 12, 1996 under 35 U.S.C. 111(b). This invention was made with government support under grant NIH-R01-H601044 awarded by the National Institutes of Health. The government has certain rights in the invention.

FIELD OF THE INVENTION

The present invention relates to compounds and methods for micromachining, and in particular, polymer-based technology for fabricating microfluidic devices.

BACKGROUND

Microfluidic systems are highly useful in medical diagnostics, environmental monitorings, biological food testing, chemical sensing and analysis. Current efforts on the fabrication of microfluidic systems and fluidic technologies have been mainly focused on individual component development. Individual components such as pumps [See M. Esashi et al. "Normally Close Microvalve and Micropump Fabricated on a Silicon Wafer," in International Workshop on Micro Electromechanical Systems (MEMS 89), pp. 29–34 (1989); R. Zengerie et al., "A Micro Membrane Pump with Electrostatic Actuation," in International Workshop on Micro Electromechanical Systems (MEMS 92), pp. 19–24 (1992); W. Zang and C. H. Ahn, "A Bi-directional Magnetic Micropump on a Silicon Wafer," in International Workshop on Solid-State Sensors and Actuators (Hilton Head '96), pp. 94–97 (1996)], valves [See T. Ohnstein et al., "Michromachined Silicon Valve," in International Workshop on Solid-State Sensors and Actuators (Hilton Head '90), pp. 95–97 (1990); J. G. Smith, "Piezoelectric Micropump with Three Valves Working Peristaltically, "Sensors and Actuators, Vol. A21–23, pp. 203–206 (1990); Y. -C Lin et al., "Characteristics of a Polyamide Microvalve," in International Workshop on Solid-State Sensors and Actuators (Hilton Head '96), pp. 113–116 (1996)], fluidic channels [J. Pfahler et al., "Liquid Transport in Micron and Submicron Channels," Sensors and Actuators, Vol. A21–23, pp. 431–434 (1990)], reaction chambers [S. Nakagawa et al., "A Micro Chemical Analyzing System Integrated on a Silicon Wafer," in International Workshop on Solid-State Sensors and Actuators (Hilton Head '90), pp. 89–94 (1990)], separation stages [D. J. Harrison et al., "Chemical Analysis and Electrophoresis Systems Integrated on Glass and Silicon Chips," in International Workshop on Solid-State Sensors and Actuators (Hilton Head '92), pp. 110–113 (1992); A. Manz et al.," Integrated Electroosmotic Pumps and Flow Manifolds for Total Chemical Analysis Systems," in Transducers '91, pp. 939–941 (1991); A. Manz et al., "Planar Chips Technology for Miniaturization and Integration of Separation Techniques into Monitoring Systems: Capillary Electrophoresis on a Chip," J. Chromatography, Vol. 593, pp. 253–258 (1992)] and detection techniques [R. C. Anderson, G. J. Bodgdan and R. J. Lipshutz, "Miniaturized Genetic Analysis System," in International Workshop on Solid-State Sensors and Actuators (Hilton Head '96), pp. 258–261 (1996)], have been fabricated using a sundry of technologies. Numerous fluidic propulsional methods have also been developed based on mechanical pumping, pneumatic forces, electrosmosis [D. J. Harrison et al., "Miniaturized Chemical Analysis Systems Based on Electrophoretic Separations and Electrosmotic Pumping," in Transducers '93, pp. 403–406 (1993)], dielectrophoresis [H. A. Pohl, Dielectrophoresis, Cambridge: Cambridge University Press (1978)], surface tension gradients [M. A. Burns et al., "Microfabricated Structures for Integrated DNA Analysis," Proc. Natl. Acad. Sci. USA, 93:5556–5561 (1996); H. Matsumoto and J. E. Colgate, "Preliminary Investigation of Micropumping Based on Electrical Control of Interfacial Tension," in International Workshop on Solid-State Sensors and Actuators (Hilton Head '90), pp. 105–110 (1990); G. Beni and M. A. Tenan, "Dynamics of Electrowetting Displays," J. Appl. Phys., Vol. 52, pp. 6011–6015 (1981), bubble generation [L. Lin et al., "Microbubble Powered Actuator," in Transducers '91, pp. 1041–1044 (1991)], and evaporation-condensation [T. K. Jun and C. J. Kim, "Miscroscale Pumping with Traversing Bubbles in Microchannels," in International Workshop on Solid-State Sensors and Actuators (Hilton Head '96), pp. 144–147 (1996)].

However, efforts on system integration of components to date have been limited [S. C. Terry et al., "A Gas Chromatographic Air Analyzer Fabricated on a Silicon Wafer," IEEE Trans. on Electron Devices, Vol. ED-26, pp. 1880–1886 (1979); A. van der Berg and P. Bergveld, Micro Total Analysis Systems, New York: Kluwer (1994)], which mainly include the use of bulk micromachining and surface micromachining technology. Both of them lack simple construction of components and the capability to integrate all of components with electronic circuitry.

Bulk micromachining technology, which includes the use of glass wafer processing, silicon-to-glass wafer bonding, has been commonly used to fabricate individual microfluidic components. In Europe, this glass-bonding technology has also been used to fabricate microfluidic systems. In these systems, the control electronics are implemented on a hybrid manner external to the system. This system integration method has several problems. Because these systems rely on bonding of substrates, it is essential that the bonding surfaces create an hermetic seal to prevent the leakage of chemicals and reagents. This poses a great difficulty when interconnection leads are present on the bonding surfaces which prevent the surfaces from being flat. It is well known that it is exceedingly difficult to attain good bonds even using well-characterized techniques such as anodic bonding when steps on the bonding surfaces exceed 0.2 $\mu$m. Because of this planarity requirement, these devices require either complex planarization schemes, or the use of diffused leads. Because of these difficulties, only relatively simple fluidic systems can be constructed using this scheme.

Unlike bulk micromachining, surface micromachining technology can be used to fabricate individual fluidic components as well as microfluidic systems with on-chip electronics. In addition, unlike bonded-type devices, hermetic channels can be built in a relatively simple manner using channel walls made of polysilicon [J. R. Webster et al., "Monolithic Capillary Gel Electrophoresis Stage with On-Chip Detector," in International Conference on Micro Electromechanical Systems (MEMS 96), pp. 491–496 (1996)], silicon nitride [C. H. Mastrangelo and R. S. Mullet, "Vacuum-Sealed Silicon Micromachined Incandescent Light Source," in Inl. Electron Devices Meeting (IDEM 89), pp. 503–506 (1989)] and silicon dioxide. Surface micromachined channels that are constructed with these thin films have two basic problems. Because the thickness of the films is limited to a few microns, the height of cavities and channels is very small (<5 $\mu$m) resulting in sub-pL sample volumes. These exceedingly small sample volumes both strain the requirements for the sensitivity limits of detection schemes and also aggravate the surface adsorption of samples and reagents on the wall which further diminishes the sample concentration. On the fabrication side, due to the strong nature of the silicon based building materials, the formation of long capillaries is difficult to accomplish. This is because the etchants used for the sacrificial etch are relatively slow and in may cases extremely reactive (such as hydrofluoric acid HF). In these structures, it is customary to leave devices in the sacrificial etch solution for many hours. Special passivation layers (primarily silicon nitride SiN) are used to passivate any active electronic devices that must survive the sacrificial etch.

What is needed is micromachining technology that allows for fabrication of channels with a flexibility in cross section and channel length at virtually no loss in system performance. In addition, the polymer technology should be low cost and should not require specialized equipment.

SUMMARY OF THE INVENTION

The present invention relates to polymer-based micro-electro-mechanical system (MEMS) technology suitable for the fabrication of integrated microfluidic systems, particularly medical and chemical diagnostics system, ink-jet printer head, as well as any devices that requires liquid- or gas-filled cavities for operation. The integrated microfluidic systems may consist of pumps, valves, channels, reservoirs, cavities, reaction chambers, mixers, heaters, fluidic interconnects, diffusers, nozzles, and other microfluidic components on top of a regular circuit substrate. This technology is vastly superior than any alternatives available such as glass-based, polysilicon-based, MEMS technology as well as hybrid 'circuit board' technology (See e.g. D. VerLee el al., "Fluid Circuit Technology: Integrated Interconnect Technology for Miniature Fluidic Devices," in *International Workshop on Solid-State Sensors and Actuators* (*Hilton Head '96*), pp. 9–12 (1996); R. C. Anderson et al., "Miniaturized Genetic Analysis System," in *International Workshop on Solid-State Sensors and Actuators* (*Hilton Head '96*), pp. 258–261 (1996); M. Albin et al., "Micromachining and Microgenetics: Where Are They and Where Do They Work Together," in *International Workshop on Solid-State Sensors and Actuators* (*Hilton Head '96*), pp. 253–257 (1996), where plastic have been used because of its high versatility to provide transparent surfaces and benign surfaces].

These microfluidic components and their process flows presented in the invention are to demonstrate the feasibility of polymer-based technology to fabricate the microfluidic systems. It is not intended that the present invention be limited by a particularly type of fabrication process mentioned.

It is not intended that the present invention be limited by the particular type of polymers. Polymers include, but are not limited to, photoresist, polyamide, benzocyclobutene, polydimethylsiloxane, vapor-deposited poly-xylene, poly-TFE, PMMA, p-HMDS, polypropylene, starch-based polymers, epoxy, and acrylics. It is not intended that the present invention be limited by the particular barrier layer if used. The barrier layers include, but is not limited to, metal, stack of different metals, polymers, silicon-based materials, and other inorganic materials.

The polymer-based micromachining technology proposed here encompasses the combined benefits of the plastic fluidic technologies while capable of integration of active microfluidic and electronic devices on a monolithic package. Hermetically sealed channels can be fabricated with a flexibility in cross section and channel length at virtually no cost to system performance. System integration is realized by the ability to fabricated various fluidic components using the same process on top of standard yet complex MOS control circuitry. In addition, the polymer technology of the present invention is very low cost and does not require specialized equipment.

DESCRIPTION OF THE DRAWINGS

FIG. 2(*a*) is a top view and FIG. 2(*b*) is a cross-section.

FIG. 4(*a*) shows the top view of a microchannel with toptype inlet fabricated using the methods of the present invention. FIG. 4(*b*) is a closeup electronmicrograph showing the three polymer construction of a channel made according to the methods of the present invention.

FIG. 5(*a*) shows the top view of a thermal cycling chamber constructed using the methods of the present invention. FIG. 5(*b*) shows the cross-section of a similar PCR thermal cycling chamber showing the large volume of the cavity.

DESCRIPTION OF THE INVENTION

The present invention relates to polymer-based micro-electro-mechanical system (MEMS) technology suitable for the fabrication of integrated microfluidic systems, particularly medical and chemical diagnostics system, ink-jet printer head, as well as any devices that requires liquid-or gas-filled cavities for operation. The integrated microfluidic systems may consist of pumps, valves, channel, reservoirs, cavities, reaction chambers, mixers, beaters, fluidic interconnects, diffusers, nozzles, and other microfluidic components on top of a regular circuit substrate.

Figure 1A:
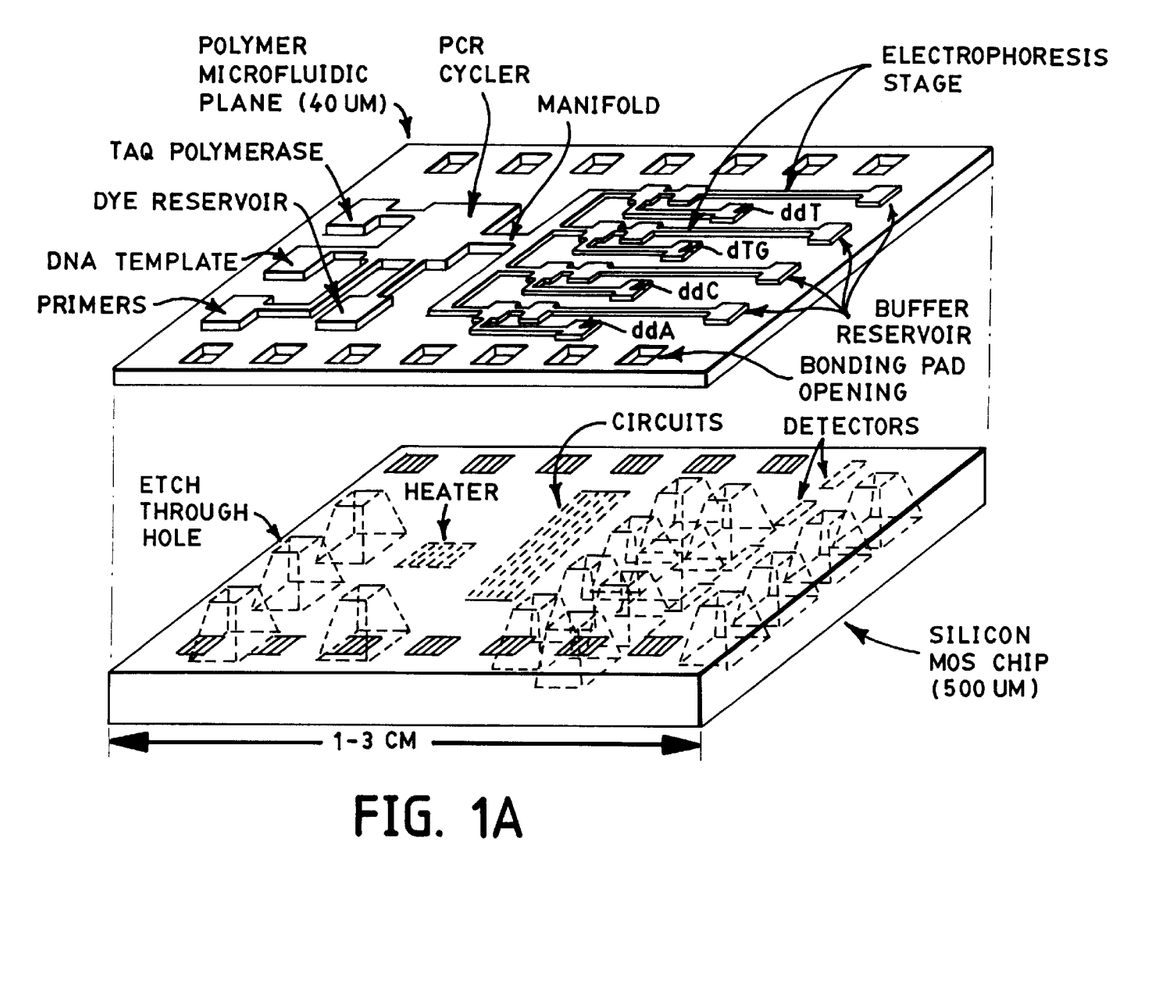
FIG. 1 is a schematic of one embodiment of an integrated microfluidic system using the technology of the present invention.
Figure 1B:
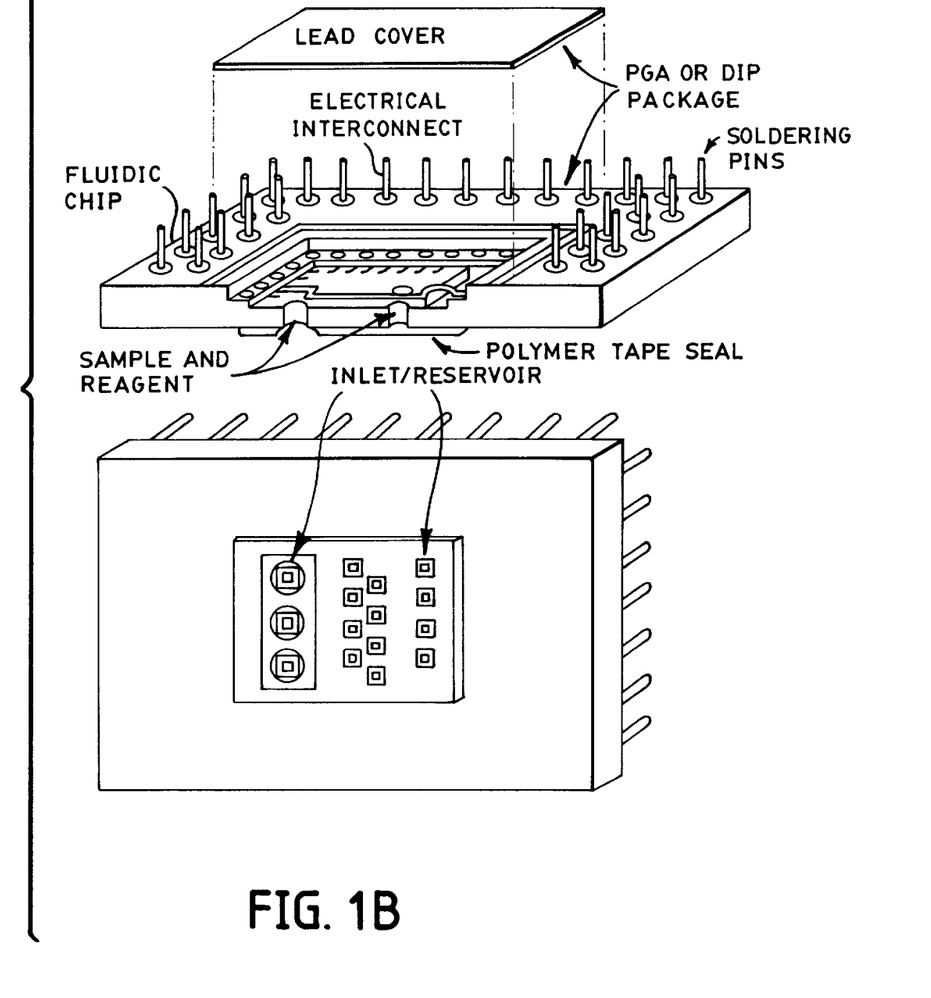

Devices fabricated under this invention consist of two planar levels of functionally (See FIG. 1). The top level consists of a polymer-based microfluidic plane, 30–50$\mu$-thick that is constructed on top of a regular silicon substrate. This plane of functionality contains all the microfluidic components of the diagnostic system such as channels, pumps, valves, thermal cycling reactor chambers, reservoirs, and electrophoresis stages. Beneath the microfluidic plane, the control, detection, drive and communication electronics are constructed in a conventional CMOS substrate chip. A series of holes are etched through the silicon substrate using anisotropic etching thus forming sample and reagent inlets and providing access to the microfluidic plane.

FIG. 1(*b*) shows the proposed packaging assembly. First, access holes are ultrasonically drilled through a PGA ceramic package. The two-plane chip is mounted on the package and wire bonds are connected on the lead side for the electrical interconnects. The "fluidic" interconnects of the system are on the opposite side of the chip and hence do not interfere with the electrical connections. The chip cavity is next closed thus isolating the fragile electronic and microfluidic components from the surrounding environment.

Figure 2:
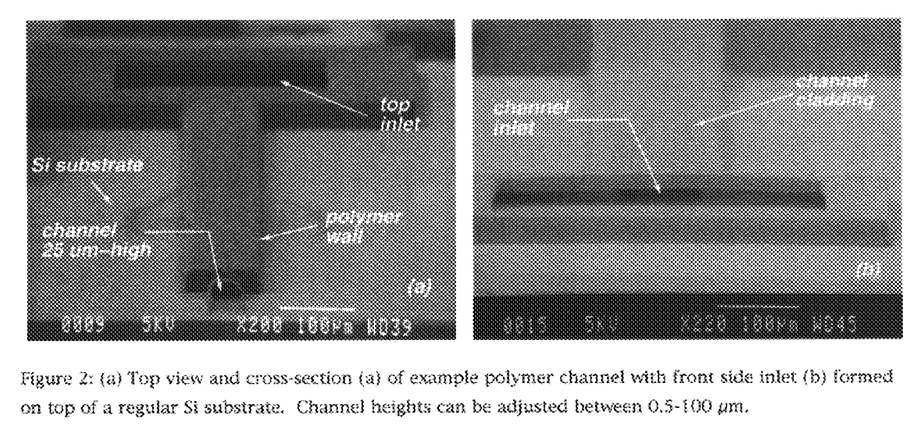
FIG. 2 is photograph of electronmicrograph of a polymer channel made according to the present invention.

FIG. 2 show SEM photographs of 25μ-high, 3 mm-long polymer channels with frontside inlet. The details of the fabrication process are discussed in the Experimental section.

The proposed technology is suitable for the construction of a wide range of automated analytical instruments hence serving as a general testbench. When properly constructed, the testbench components can be configured to perform many different functions thus in essence forming a "fluidic microprocessor". The present invention contemplates the use of a common fluidic interconnect (i.e., a fluidic bus) to move samples from any reservoir (or fluidic register) to any other, as well as allowing for controlled mixing. The set of mixing operations performed by the fluidic processor can be controlled by an external logic circuit.

The invention of polymer-based micromachining technology is vastly superior than those based on wafer bonding bulk micromachining, polysilicon surface micromachining, and hybrid plastic 'circuit board' technology in the following nine categories. (a) The microfluidic plane fabrication is implemented by deposition of low-temperature layers that do not degrade or change the underlying circuit characteristics or its conventional process flow. (b) The fluidic-plane is fabricated using weak chemicals that do not attack the circuit plane in any way. Therefore, complex microfluidic devices can be fabricated using a regular MOS substrate plane containing the control circuitry, and a polymer-based microfluidic plane constructed on top of it. (c) Leak-tight channels are formed due to the conformality of the polymer deposition (a severe problem present in glass bonded devices): (d) Tall channels and chambers of different heights can be easily fabricated. Unlike silicon-based films, these polymers can be quite thick with a thickness reported as high as 200μ. Currently we can fabricate channels that range from 0.5 to 100 μm in height. (e) Very long channels can be fabricated with short etching times (also a problem with poly-Si). (f) Polymer channel walls do not have the severe surface adsorption problems observed in silicon and glass walls. (g) Polymer channels are optically transparent and are therefore are much simpler to test. (h) Its process simplicity and its capability of integrating individual fluidic components together make integrated microfluidic system possible. (i) Its batch-processing ability make microfluidic system inexpensive.

The following sections show several fabrication processes of microfluidic components. These microfluidic components and their process flows are presented to demonstrate the feasibility of polymer-based technology to fabricate the microfluidic systems. It is not intended that the present invention be limited by a particular type of fabrication process.

I. Basic Polymer Process: Channel

Figure 3:
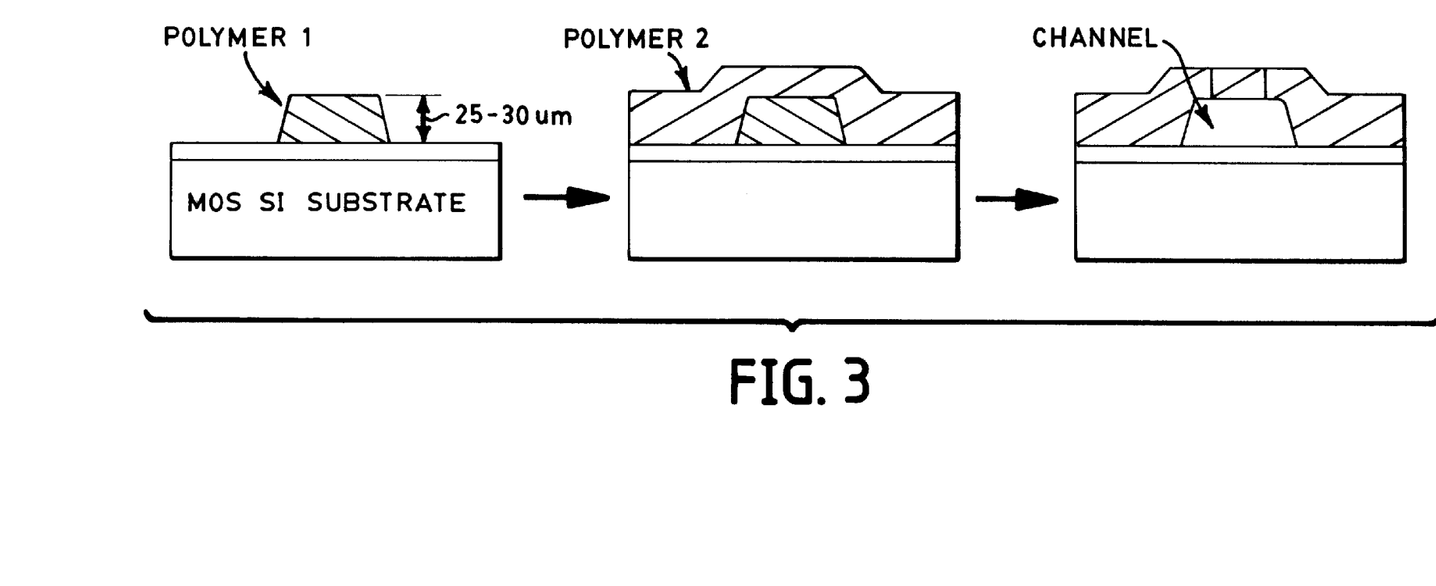
FIG. 3 is a schematic showing a simplified fabrication method of the present invention.

The basic fabrication process begins with a conventional silicon CMOS processed substrate, as shown in FIG. 3. In this figure, inlet and outlet are etched from the front side. However, backside inlet and outlet can easily be made by etching holes into the substrate from the backside using an anisotropic etchant such as ethylenediamine pyrazine (EDP), tettamethylammonium hydroxide (TMAH) or even $XeF_2$ stopping at the passivation oxide or nitride (also see Section III). Other alternatives on passivation layer includes oxide/nitride/oxide and low stress silicon-rich silicon nitride. Next, the microfluidic plane is constructed using the simplified process shown below. First a thick polymer layer is deposited and photolithographically defined onto the substrate with the thickness required for the channel height (0.5–100 μm). Next a second polymer is deposited serving as the walls of the channels. The second polymer is next etched defining the extent of the channel walls. Holes to polymer 1 can be etched either from the front or through the backside by plasma etching the passivation oxide (see Section III). Polymer 1 is now sacrificially etched leaving a channel behind. In some cases where polymer 2 may react with polymer 1, a third material serves as a barrier layer, is deposited in between polymer 1 and polymer 2. The barrier layer has to be relatively conformal to provide a complete lack of physical contact of polymer 1 from polymer 2.

Figure 4:
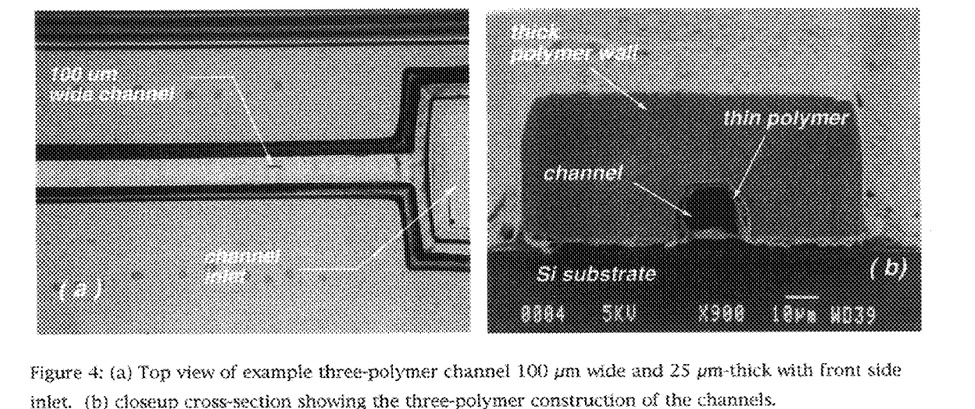

FIG. 4 is an example of a simple polymer channel: FIG. 4(a) shows the top view of a 100 μm wide, 25 μm-high channel with top type inlet fabricated using this process. Channels as long as 3 mm are completely sacrificially realease in under 20 minutes time. These channels are optically clear. FIG. 4(b) shows a closeup SEM showing the three polymer construction of a 15 μm-high channel with 40 μm-thick walls.

In this example, photodefinable polyamide is used as polymer 2, vapor-deposited p-xylylene as the thin intermediate barrier material, and thick photoresist as polymer 1.

The details of embodiments of the fabrication process are set forth in the Examples. It is not intended that the present invention be limited by the particular type of polymers.

Polymers include, but are not limited to, photoresist, polyamide, benzocyclobutene, polydimethylsiloxane, vapor-deposited poly-xylene, poly-tetrafluoroethylene, PMMA, poly-HMDS, polypropylene, starch-based polymers, epoxy, and acrylics. In addition, it is not intended that the present invention be limited by the particular barrier layer. The barrier layers include, but is not limited to, metal, stack of different metals, poly-TFE, polymers, silicon-based materials, and other inorganic materials. Fluidic Interconnects can also easily be fabricated as shown in Example 2 (below).

II. Reservoir, Mixer, Reaction Chamber, Cavities

Figure 5:
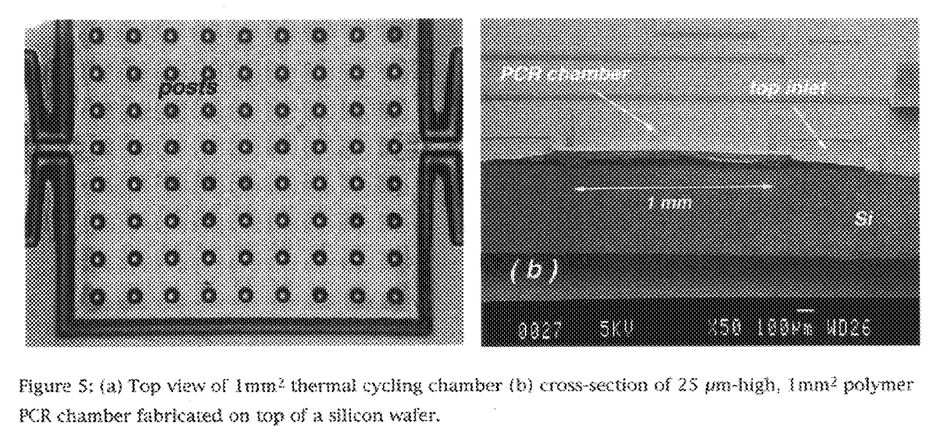

Reservoirs, mixers, reaction chambers, and any cavities can be formed by proper enlargement of the channels while heaters, detectors, and active circuits reside on the CMOS plane below. FIG. 5 shows an example of a reaction chamber. The details of one embodiment of the fabrication process are set forth in the Examples. FIG. 5a shows the top view of 1 $mm^2$, 25 μm-high thermal cycling chamber constructed using this process. The dots on the cavity are posts periodically spaced inside the cavity which enhance mixing and stiffen the cavity to prevent it collapse. The cavity is connected at both ends with short channels leading to top inlets and outlets. FIG. 5(b) shows the cross-section of a similar (polymerase chain reaction) thermal cycling chamber showing the large volume of the cavity. Ink-jet printer head can be fabricated similar to the PCR reactor except that there are arrays of etch holes (circular or square) on the structural polymer. Instead of forming post in the large cavity, internal walls are built so that each etch hole is isolated and is connected to an internal reservoir, which stores ink. Under each isolated cavity, heaters are placed or suspended on top of the substrate.

III. Actuator

Figure 6:
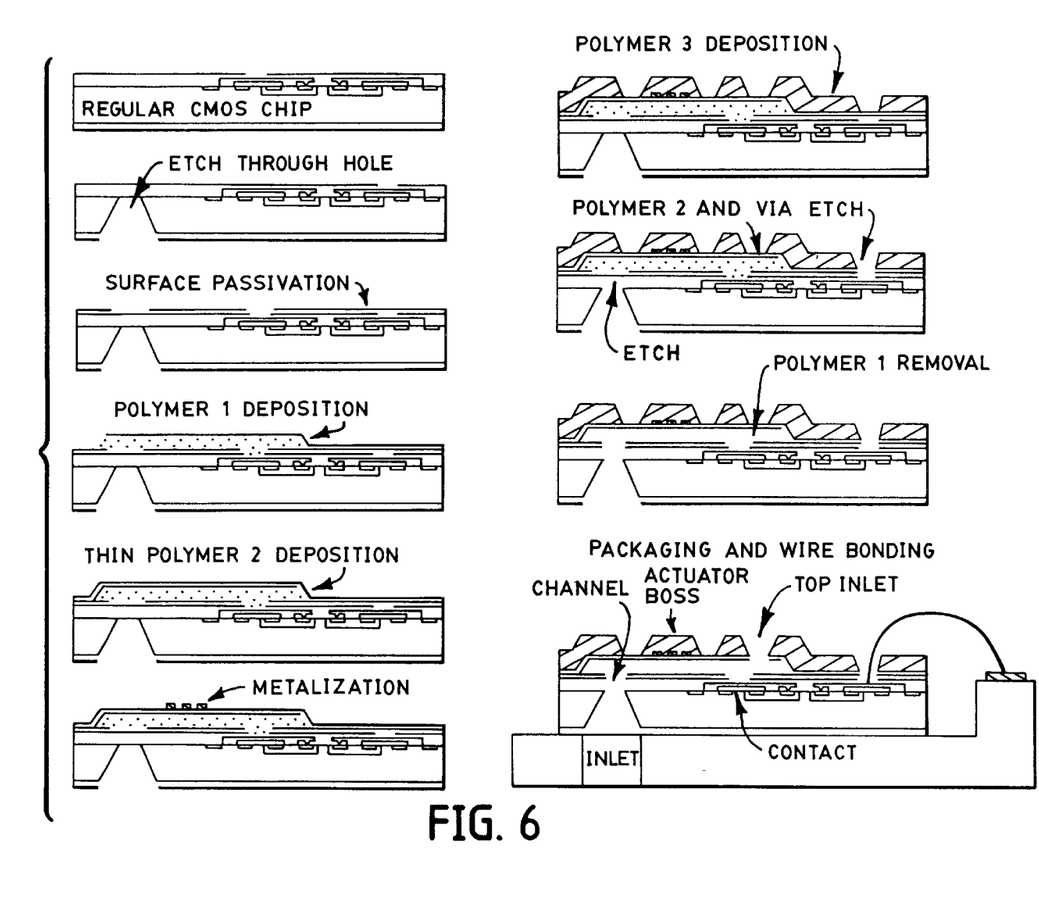
FIG. 6 is a series of schematics showing the basic process steps of one embodiment of the fabrication method of the present invention.

The same process also allows the fabrication of actuators such as valves and pumps. The polymer process must include the following layers: (1) a sacrificial polymer layer for forming cavities and channels; (2) a thick elastic structural polymer layer for forming elastic diaphragms needed in pumps and valves. This thin polymer can also serve as a barrier layer in some cases; (3) a thick structural polymer layer for construction of thick channel walls and bossed diaphragms; and (4) a metal layer that can carry current either embedded between (2) and (3) or on top of layer (3). FIG. 6 shows the basic process steps carried out to fabricate the actuator.

The process begins with a conventional CMOS, bipolar, or BiCMOS substrate passivated by a layer of silicon dioxide. Metal lines can be present on the circuit side if desired. The next step in the process consists of the opening of holes on the backside oxide by plasma etching. These holes will provide access to the microfluidic polymer plane. After this step, the circuit substrate is immersed in a silicon rich TMAH solution that anisotropically etches the substrate all the way to the passivation oxide layer. The cavities formed by this etch are bounded by the 111 crystal planes of the substrate. The silicon saturated TMAH solution will not attack any aluminum wires exposed on the surface [U. Schankenberg et al., "TMAHW Etchants for Silicon Micromachining," in *Transducers* '91, pp. 815–818 (1991)].

After rinsing and drying the substrates, a passivation layer is deposited on top of the circuits and subsequently patterned. The passivation layer is needed if the system being built must handle fluids that contain mobile ions such as sodium ions and potassium ions (many biochemical reactions require weak KCl buffer solutions) which can easily diffuse through the oxide passivation of the circuit plane. Several types of passivation layers can be used (or even none). Conventional materials such as sputtered SiN serve the purpose quite well. Polymers can also be used as a barrier to the contaminant diffusion. The barrier layer is next photolithographically defined and etched on the areas leading to the backside inlet and metal contact areas.

Wafers that have reached this state are ready for the construction of the microfluidic plane. First a thick polymer 1 layer is deposited and etched on top of the substrate. This thick polymer serves as a spacer layer that determines the height of channels and microfluidic components. Multiple thicknesses on the same wafer can be obtained through time etching or multiple depositions. The range of thicknesses for this polymer is between 0.5–200 $\mu$. Next a thin layer of polymer (polymer 2) 0.5–2 $\mu$m thick is deposited uniformly onto the wafer. Polymer 2 serves as a thin structural layer that is easily deflected, and as a barrier layer in some cases. Its main purpose is for the fabrication of flexible membranes required by the pumps and valves described earlier. Next, a thin layer 1–2 $\mu$m of aluminum is evaporated on top of polymer 2 and it is photolithographically defined to form parallel conductors and interconnects used in the fluidic actuators. The process is followed by the deposition and patterning of a thick polymer (polymer 3) that provides structural support for the channels and microfluidic component walls. Next holes are opened on the thin polymer 2 layer leading to bonding pads on the circuit plane and also providing access to polymer 1 if desired from the front side. At this point the remaining passivation oxide that separates polymer 1 from the backside inlets is etched by plasma etching. In the last step of the process, polymer 1 is sacrificially etched thus releasing the channels and fluidic actuators. The chips are next mounted on a ceramic package and the electrical leads are formed by wire bonding. As an example, polymer 1 can be photoresist, polymer 2 can be poly-xylene, and polymer 3 can be polyamide.

Figure 7:
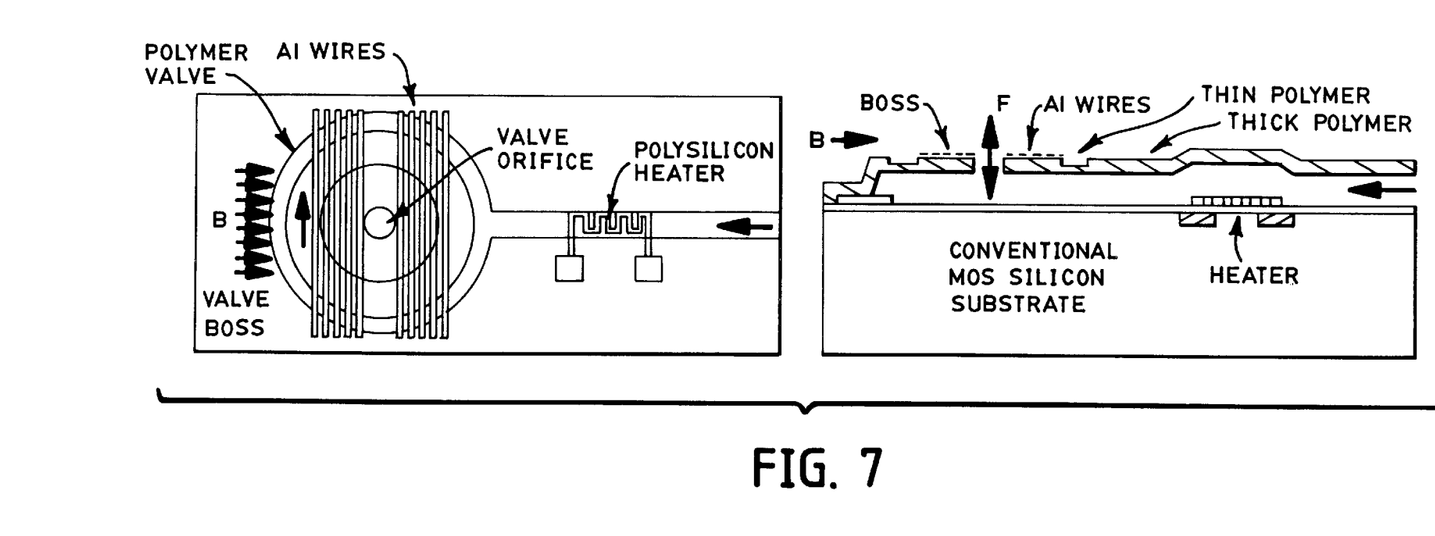
FIG. 7 is a schematic showing the a simple suction pump.

Droplets of the samples must be moved to the various parts of the system in order to perform various tests on the fluidic chip. A thermocompression suction pumps that create a pressure differential between the two sides of the liquid drop can be used. A simple suction pump can be constructed as shown in FIG. 7. The pump basically consists of a heater and a valve. This device is constructed with an additional thin polymer layer and an embedded metallization inserted on the microfluidic plane. The construction of this type of pump is thus entirely compatible with the polymer-based technology. This pump basically consists of a heater constructed on the MOS plane placed under the polymer channel, and an exhaust valve. The exhaust valve consists of an enlarged version of the channel with a central outlet. On top of the polymer valve, a series of parallel aluminum wires are patterned. The aluminum wires are placed between a thin polymer and a thick one thus forming a boss region and a diaphragm. This valve is magnetically actuated upon application of a transversal magnetic field B (through an external permanent magnet).

The valve either closes or opens depending on the direction of the current I on the parallel conductors. Magnetic actuation was chosen for the valve because the tall channels generated by the polymer-based process have very high pull-in voltages hence rendering electrostatic actuation impractical.

The thermocompression pump operates as follows: first, the exhaust valve is opened and the heater is powered up. Next the valve is closed and the heater is turned off thus forming a partial vacuum on the channels as the trapped air cools down. This partial vacuum propels the drop forward until the pressure difference disappears. The cycle is repeated for continuous pumping. Propulsion of the droplet in the reverse direction can also be achieved by expanding the gas rather than contracting it. This type of simple pump can generate pneumatic pressure differences as high as 0.5 atm, well above the threshold needed for the onset of motion of droplets in capillaries. If the pneumatic drop motion mechanism is used, pass-through values are needed into the system. These valves basically constrict the channels at various points in the system thus acting as gates that block the passage of liquids. Pass-through valves are necessary to impede the continuous drawing of liquids onto the capillary. This situation occurs due to the fact that when droplets are moved inside the caillary channels, they form a partial vacuum behind them which can in turn move drops on other parts of the system. Pass through valves impede the entrance of these drops onto places where there exist temporary vacuum pressure differences. It is also important to point out that once a channel is blocked, it is necessary to open an exhaust valve (such as those made for the thermocompression pump) attached to the same end as the blocking valve if additional liquid drop motion is desired. The exhaust valve provides and additional inlet that impedes the formation of a vacuum behind the moving drop that would ultimately stops and additional drop motion.

Figure 8:
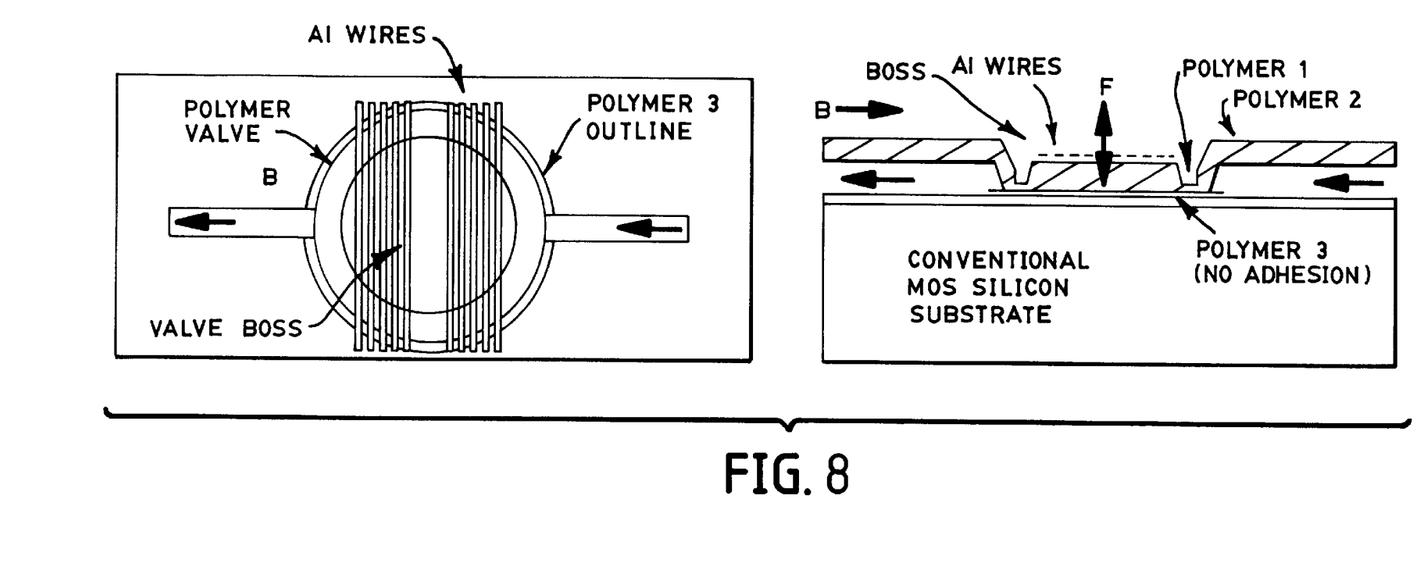
FIG. 8 is a schematic showing the cross-section of a pass-through valve implemented using the polymer based channel technology of the present invention.

This brings the important point that pumping of discrete drops can only be accomplished when one of channel ends is open to the environment. This problem has been pointed out by Anderson (supra) who has proposes the use of permeable membranes to eliminate this problem. FIG. 8 shows the cross-section of a passthrough valve implemented using the polymer based channel. The valve basically consists of a flat round segment of an enlarged channel that is constructed in its collapsed form by the deliberate removal of polymer 1. A patch of polymer 3 (TEFLON, i.e. polytetrafluoroethylene) is placed under the valve such that polymer 2 does not stick to the surface.

The valve is opened or closed by applying a current to the conductors above the passthrough valve which buckle the diaphragm upward thus opening the valve.

These basic components are necessary to achieve complete motion control of the liquid sample droplets.

Experimental

The following examples serve to illustrate certain preferred embodiments and aspects of the present invention and are not to be construed as limiting the scope thereof.

EXAMPLE 1

This example describes one embodiment of the fabrication method of the present invention. More specifically, this example describes one embodiment of the process flow for channels and cavities with frontside inlets and outlets. The process starts with a 4 inch silicon wafer. Thereafter, the steps are as follows:

0. (Optional) Deposit $2\mu$-thick poly-xylene with primer.

1. HMDS is spread at 200 rpm for 16 s, and spun at 400 rpm for 30 s.

2. Photoresist (AZP4620) is spread at 200 rpm for 16 s, and spun at 750 rpm for 50 s (about $20\mu$-thick). Experiments reveal that this resist does not stick too well with silicon substrate without applying HMDS. For some other resist, HMDS may not be applied.

3. Remove the resist beads which reside on the edge of the wafer using a Q-TIP cotton swab soaked with acetone. This step is necessary because these beads will glue to the mask plate during mask aligning.

4. Soft baked on a hot plate for 2 mins. at 130° C. Lower temperature with longer bake time should also work.

5. Patterned and exposed at intensity of 1250 ml/cm$^2$.

6. Developed for 16 mins in AZ312: H20=1:1.

7. Hard baked at 130° for 3 mins.

8. Plasma etching using $O_2$ at 80 W: 250 mT for 2 mins. Longer etching time may burn the resist.

9. Deposit 2 $\mu$m-thick poly-xylene without applying primer. The poly-xylene will crack if it is too thin, and resist will crack if primer is applied. Without primer, the adhesion between poly-xylene and silicon substrate is not too good.

10. Plasma etching using $O_2$ at 80 W for 2 mins. This dry etching is necessary to improve the adhesion between parylene and polyamide.

11. Polyamide (Polyamide 7020 from OCG) is spread at 200 rpm for 10 s, and spun at 2500 rpm for 10 s (about $40\mu$-thick).

12. Soft bake at 90° C. for 2 mins, followed by baking at 110° for 7 mins.

13. Patterned and exposed at intensity of 350 ml/cm$^2$.

14. Bake at 105° C. for 1 mins.

15. Let it rest for 30 mins.

16. Develop (QZ2501 from OCG) for 6 mins. Agitate.

17. Rinse (QZ3512 from OCG) for 2 mins. Agitate. If some white residual is observed, put the wafer to the developer.

18. Blow dry.

19. Repeat Step 2 to 6. No HMDS is applied because adhesion between poly-xylene and polyamide is strong enough.

20. Etching poly-xylene: Plasma etching using $O_2$ at 250 W, 250 mT for 20 mins.

21. Sacrificial release: Immersed into hot Acetone for 20 mins.

22. Rinse with IPA and water.

23. (Optional) Final Cure 250° for 30 mins. Higher temperature may burn poly-xylene.

EXAMPLE 2

This example describes another embodiment of the fabrication method of the present invention. More specifically, this example describes one embodiment of the process flow for fluidic interconnect. The process starts with a 4 inch silicon wafer. Thereafter the steps are as follows:

1. Repeat Step 11 to 18 from Example 1.

2. Repeat Step 2 to 6 from Example 1.

3. Repeat Step 9 to 22 from Example 1.

4. (Optional) Final Cure 250° for 30 mins. Higher temperature may burn poly-xylene.

What is claimed is:

1. A method for fabricating microchannels, comprising the steps:
   a) providing a substrate, said substrate having upper and lower surfaces;
   b) depositing a first polymer layer on said upper surface of said substrate, said first polymer layer having i) a lower surface contacting said upper surface of said substrate and ii) an upper surface;
   c) depositing a second polymer layer on said upper surface of said first layer, said second polymer layer having i) a lower surface contacting said upper Surface of said first layer and ii) an upper surface;
   d) exposing said first polymer, and
   e) sacrificially etching said first polymer layer under conditions such that said second polymer layer comprises walls of a microchannel.

2. The method of claim 1, wherein said substrate is a silicon substrate.

3. The method of claim 1, wherein said desired thickness of said first polymer layer is between 0.5 and $100\mu$.

4. The method of claim 1, further comprising, prior to step (d) the step of photolithographically defining said second polymer layer.

5. The method of claim 1, further comprising, after step (e) the step (f) of etching openings in said walls of said microchannel.

6. The method of claim 5, further comprising after step (e) and before step (f) the step of depositing a third polymer layer on said upper surface of said second polymer layer.

7. The method of claim 1, wherein said first polymer and said second polymer comprise photoresist polymeric material.

8. A method for fabricating microchannels, comprising the steps:
   a) providing a silicon substrate, said silicon substrate having tipper and lower surfaces;
   b) depositing a first polymer layer with a defined thickness of 0.5 to 100 $\mu$m on said upper surface of said silicon substrate, said first polymer layer having i) a lower surface contacting said upper surface of said silicon substrate and ii) an upper surface;
   c) photolithographically defining said first polymer;
   d) depositing a second polymer layer on said upper surface of said first layer, said second polymer layer having i) a lower surface contacting said upper surface of said first layer and ii) an upper surface;
   e) exposing said first polymer, and
   f) sacrificially etching said first polymer layer under conditions such that said second polymer layer comprises walls of a microchannel.

9. The method of claim 8, wherein said desired thickness of said first polymer layer of step (c) is between 0.5 and $100\mu$.

10. The method of claim 8, further comprising, prior to step (e) the step of photolithographically defining said second polymer layer.

11. The method of claim 8, further comprising, after step (f) the step (g) of etching openings in said walls of said microchannel.

12. The method of claim 11, further comprising after step (f) and before step (g) the step of depositing a third polymer layer on said upper surface of said second polymer layer.

13. The method of claim 8, wherein said first polymer and said second polymer comprise photoresist polymeric material.

14. A method for fabricating microchannels, comprising the steps:

a) providing a silicon wafer, said silicon wafer having upper and lower surfaces;

b) depositing a first layer of a first polymer on said upper surface of said silicon wafer, said first polymer layer having i) a lower surface contacting said upper surface of said silicon wafer and ii) an upper surface;

c) depositing a second polymer layer with a defined thickness of 0.5 to 100 $\mu$m on said upper surface of said first layer, said second polymer layer having i) a lower surface contacting said upper surface of said first layer and ii) an upper surface;

d) photolithographically defining said second polymer;

e) depositing a second layer of said first polymer on said upper surface of said second polymer layer, said second layer of said first polymer having i) a lower surface contacting said upper surface of said second polymer layer and ii) an upper surface;

f) exposing said second polymer, g) sacrificially etching said second polymer layer under conditions such that said first and second layers of said first polymer comprise walls of a microchannel, said microchannel having a height defined by said thickness of said second polymer layer; and h) etching one or more openings in said walls of said microchannel.

15. The method of claim 14, further comprising after step (g) the step of depositing a layer of a third polymer on said upper surface of said second layer of said first polymer.

16. The method of claim 15, wherein said first and second layers of said first polymer comprise vapor-deposited polyxylene.

17. The method of claim 16, wherein, at step (h), first and second openings are etched, said first opening serving as an inlet and said second opening serving as an outlet.

18. The method of claim 17, wherein said openings are etched from said lower surface of said silicon wafer into said lower surface of said first layer of said first polymer.

19. The method of claim 17, wherein said openings are etched from said upper surface of said layer of said third polymer into said upper surface of said second layer of said first polymer.

* * * * *